United States Patent
Dangler et al.

(10) Patent No.: US 11,382,210 B1
(45) Date of Patent: Jul. 5, 2022

(54) DIELECTRIC MATERIAL CHANGE TO OPTIMIZE ELECTRICAL AND MECHANICAL PROPERTIES OF FLEX CIRCUIT

(71) Applicant: International Business Machines Corporation, Armonk, NY (US)

(72) Inventors: John R. Dangler, Rochester, MN (US); Arthur J Higby, Cottekill, NY (US); Philipp K Buchling Rego, Wappingers Falls, NY (US); David Clifford Long, Wappingers Falls, NY (US); James Busby, New Paltz, NY (US); Matthew Doyle, Chatfield, MN (US); Edward N. Cohen, Kingston, NY (US); Michael Fisher, Poughkquag, NY (US); William Santiago-Fernandez, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 8 days.

(21) Appl. No.: 17/124,621

(22) Filed: Dec. 17, 2020

(51) Int. Cl.
*H05K 1/02* (2006.01)
*H05K 1/03* (2006.01)
(Continued)

(52) U.S. Cl.
CPC ........... *H05K 1/028* (2013.01); *H05K 1/0346* (2013.01); *H05K 3/44* (2013.01); *H05K 5/0208* (2013.01); *H05K 2201/0154* (2013.01)

(58) Field of Classification Search
CPC .......... H05K 1/028; H05K 1/18; H05K 1/181; H05K 1/189; H05K 5/0004; H05K 5/0047;
(Continued)

(56) References Cited

U.S. PATENT DOCUMENTS 5,084,345 A 1/1992 Manos
5,144,534 A 9/1992 Kober
(Continued)

FOREIGN PATENT DOCUMENTS

DE 102018212310 A1 * 1/2020
JP 5976588 B2 7/2016

OTHER PUBLICATIONS

D. Shaddock and L. Yin, "High temperature electronics packaging: An overview of substrates for high temperature," 2015 IEEE International Symposium on Circuits and Systems (ISCAS), 2015, pp. 1166-1169, doi: 10.1109/ISCAS.2015.7168846. (Year: 2015).*

(Continued)

*Primary Examiner* — Timothy J Thompson
*Assistant Examiner* — John B Freal
(74) *Attorney, Agent, or Firm* — Robert R. Williams

(57) ABSTRACT

A uniform thickness flex circuit is taught that uses more than one dielectric layer. A first dielectric layer is more flexible and capable of reliably bending at a radius of curvature at which a second dielectric layer cannot be reliably bent. The second dielectric layer has at least one more desirable electrical characteristic than the first dielectric area, for example leakage. Use of the uniform thickness flex circuit to protect sensitive material in an electronic enclosure is also described.

9 Claims, 16 Drawing Sheets

Cross Section at B-B
Electronic Enclosure
400

(51) Int. Cl.
*H05K 5/02* (2006.01)
*H05K 3/44* (2006.01)

(58) Field of Classification Search
CPC .. H05K 5/0208; H05K 5/069; H05K 2201/01; H05K 2201/0104; H05K 2201/0187; H05K 2201/0191; H05K 1/0275; H05K 1/0277; H05K 1/0278; H05K 1/0393; H05K 1/11; H05K 1/111; H05K 1/118; H05K 1/147; H04K 2201/0154
See application file for complete search history.

(56) References Cited

U.S. PATENT DOCUMENTS

| | | | |
|---|---|---|---|
| 6,916,544 | B2 | 7/2005 | Moriyama et al. |
| 7,348,080 | B2 | 3/2008 | Kanakarajan |
| 9,089,071 | B2 | 7/2015 | Dangler et al. |
| 10,595,419 | B1 | 7/2020 | Higby et al. |
| 2004/0020687 | A1* | 2/2004 | Moore ............... H05K 1/0212 219/209 |
| 2004/0135656 | A1* | 7/2004 | Sinsheimer ........... H05K 1/024 333/238 |
| 2006/0009615 | A1 | 1/2006 | Uhara |
| 2007/0064054 | A1 | 3/2007 | Hayden et al. |
| 2008/0110020 | A1* | 5/2008 | Heisen .................. H05K 1/028 29/829 |
| 2015/0003083 | A1 | 1/2015 | Uehara |
| 2015/0282304 | A1* | 10/2015 | Ely ..................... H05K 1/0281 174/254 |
| 2016/0057856 | A1* | 2/2016 | Woodford ............... H05K 1/18 361/748 |
| 2019/0239355 | A1* | 8/2019 | Iannotti ................. H05K 1/147 |

OTHER PUBLICATIONS

DE 102018212310 A1 (Translation) (Year: 2021).*
Unpublished Patent Application. Per MPEP 609 the following is required: Inventor: Doyle, et al. U.S. Appl. No. 16/702,160, filed Dec. 3, 2019.

* cited by examiner

Fig. 1A  Top View Flex Circuit 101

Cross Section at A-A Flex circuit 101
Before and After Bending

| Raw materials as received and before lamination | | | | |
|---|---|---|---|---|
| | | | | Raw material as received  3 core2 bondply |
| | | Raw material description | Nominal thickness in mils as received | ↓ 202 |
| AP7163E | 201 Core 1 | 1/4 ounce Cu layer 1 | 0.35 | 203 |
| | | 1 mil polyimide | 1.00 | |
| | | 1/4 ounce Cu layer 2 | 0.35 | 204  232  233 |
| FR7021 | 231 Bonding film 1 | 1.2 mil FR adhesive | 0.50 | |
| | | 1.2 mil polyimide | 0.50 | |
| | | 1.2 mil FR adhesive | 0.50 | 212  234 |
| AP7163E | 211 Core 2 | 1/4 ounce Cu layer 3 | 0.35 | 213 |
| | | 1 mil polyimide | 1.00 | |
| | | 1/4 ounce Cu layer 4 | 0.35 | 214  242  243 |
| FR7021 | 241 Bonding film 2 | 1.2 mil FR adhesive | 0.50 | |
| | | 1.2 mil polyimide | 0.50 | |
| | | 1.2 mil FR adhesive | 0.50 | 222  244 |
| AP7163E | 221 Core 3 | 1/4 ounce Cu layer 5 | 0.35 | 223 |
| | | 1 mil polyimide | 1.00 | |
| | | 1/4 ounce Cu layer 6 | 0.35 | 224 |

Fig. 2A
Raw Materials for Flex
Circuit using FR Dielectric
(FR7021)

FR Cross Section Area After Etching
and Before Lamination

FR Cross Section Area After Etching and Lamination

| Raw materials as received and before lamination | | | | Raw material as received 3 core/2 bondply |
|---|---|---|---|---|
| | | Raw material description | Thickness in mils as received | ↓ 302 |
| AP7163E | Core 1 | 1/4 ounce Cu layer 1 | 0.35 | 303 |
| | | 1 mil polyimide | 1.00 | |
| | | 1/4 ounce Cu layer 2 | 0.35 | 304 |
| HT | Bonding film 1 — 331 | HT polyimide | 1.50 | HT polyimide 333 |
| AP7163E | Core 2 — 311 | 1/4 ounce Cu layer 3 | 0.35 | 312 |
| | | 1 mil polyimide | 1.00 | 313 |
| | | 1/4 ounce Cu layer 4 | 0.35 | 314 |
| HT | Bonding film 2 — 341 | HT polyimide | 1.50 | HT polyimide 343 |
| AP7163E | Core 3 — 321 | 1/4 ounce Cu layer 5 | 0.35 | 322 |
| | | 1 mil polyimide | 1.00 | 323 |
| | | 1/4 ounce Cu layer 6 | 0.35 | 324 |

Fig. 3A

Raw Materials for Flex
Circuit using HT Dielectric

HT Cross Section Area After Etching and Before Lamination

HT Cross Section Area After Etching and Lamination

Side by Side comparison of FR (left) and HT (right) Flex Circuit

Cross Section at B-B
Electronic Enclosure
400

Top View of Electronic
Enclosure 400

Electronic Enclosure 400
cross section at B-B

Cross Section
Electronic
Enclosure 500

DIELECTRIC MATERIAL CHANGE TO OPTIMIZE ELECTRICAL AND MECHANICAL PROPERTIES OF FLEX CIRCUIT

BACKGROUND

The present disclosure generally relates to an electronic system having a flex circuit. The flex circuit may be in an electrical enclosure. The flex circuit in the electrical enclosure is bent, or formed, at a particular bend with a first radius of curvature in a first area on the flex circuit. A first dielectric in the flex circuit is used in the first area and a second dielectric in the flex circuit is used in a second area on the flex circuit that has a longer radius of curvature or is a flat area.

SUMMARY

Embodiments of the invention provide a flex circuit of uniform thickness having a first dielectric having properties that allow the flex circuit to bend without damage to electrical conductors in the flex circuit and a second dielectric having properties that provide lower leakage than leakage in the first dielectric.

In an embodiment, the first dielectric has a lower modulus of elasticity than the second dielectric so that the first dielectric is capable of bending at a smaller radius of curvature than the second dielectric. The first dielectric has a higher electrical leakage than the second dielectric.

In an embodiment of the invention, for nonlimiting example, the first dielectric is "FR", where FR is in reference to a Fire Retardant modified acrylic adhesive. The second dielectric is "HT" in reference to a class of High Temperature laminate materials that feature favorable material and electrical characteristics. Such materials may have a higher glass transition temperature (Tg) and lower loss characteristics than materials such as FR. Both the first and second dielectric areas may use an AP core upon which metallization is formed and etched to provide electrical wiring paths. "AP" is generally used herein, in reference to a class of Adhesive-less/high-Performance laminate materials that include a copper-clad laminate and an all-polyimide composite of polyimide film bonded to copper foil. AP7163E is used as an exemplary "AP" film herein.

In an embodiment of the invention, a pattern of conductors in one or more wiring levels in the flex circuit is formed. The pattern of conductors may be signal conductors coupling a first semiconductor chip to a second semiconductor chip. A battery may supply energy to the first semiconductor chip and to the second semiconductor chip. The pattern of conductors may be a serpentine pattern that would be broken by drilling or tearing to show tampering of electrical enclosure.

BRIEF DESCRIPTION OF THE SEVERAL VIEWS OF THE DRAWINGS

FIGS. 1A and 1B show top and cross sectional views of a flex circuit, with wiring levels and sections having a first dielectric area and a second dielectric area.

FIG. 2A shows a cross section of raw materials before etching and lamination of a cross section where FR is used as a dielectric.

FIG. 3A shows a cross section of the raw materials before etching and lamination of a cross section where HR is used as a dielectric.

DETAILED DESCRIPTION

Figure 1B:
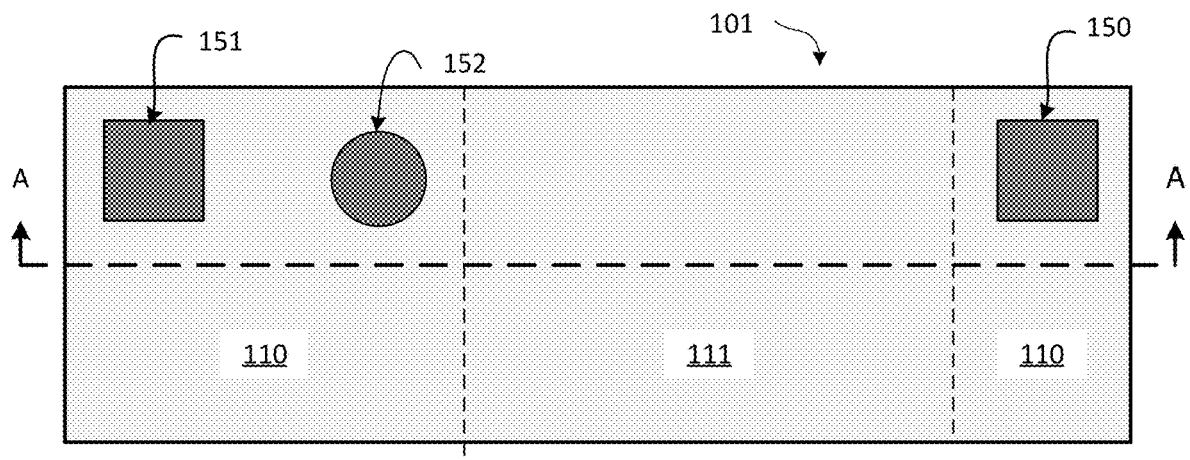
Figure 1B:
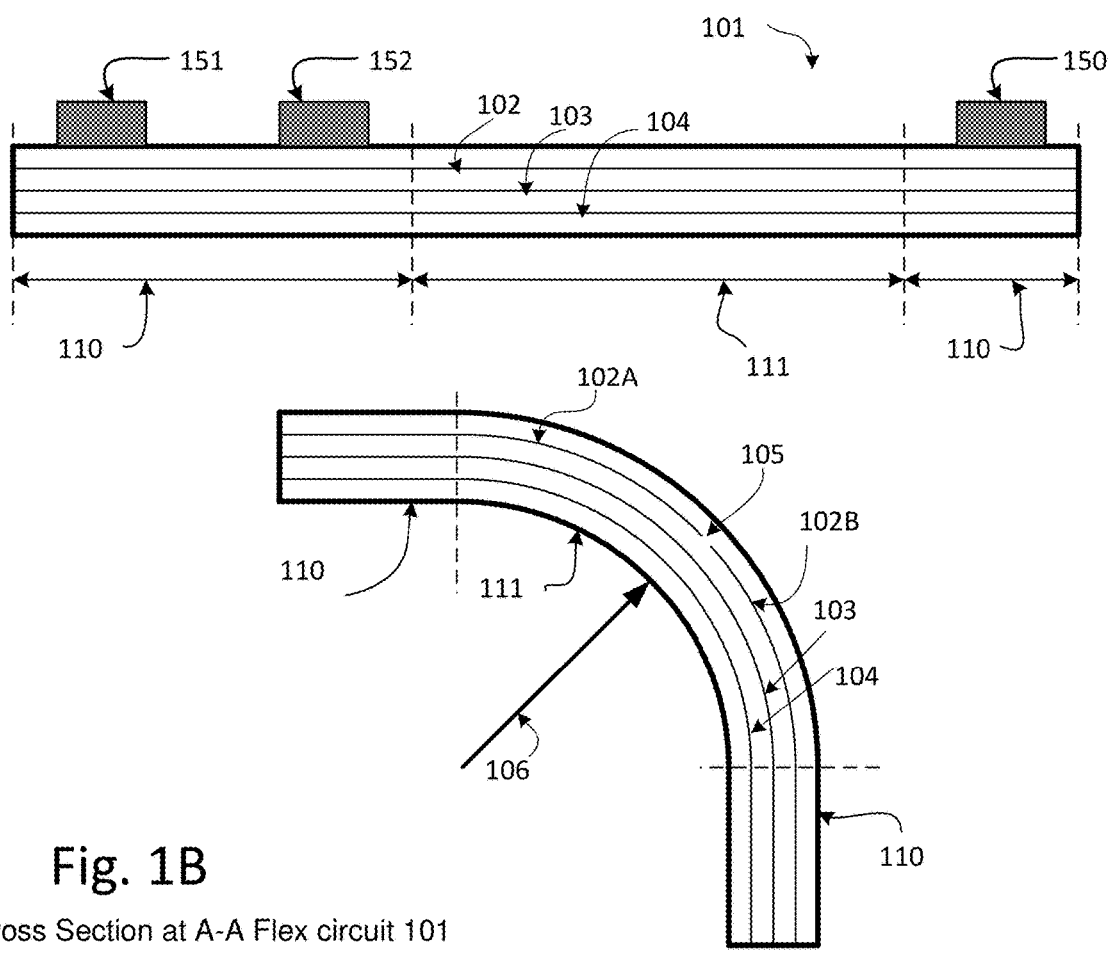

The present disclosure generally relates to an electronic system having a flex circuit that must be bent or folded sharply. The flex circuit may be in an electrical enclosure. The flex circuit in the electrical enclosure is bent, or formed, at a particular bend with a first radius of curvature in a first area on the flex circuit. A first dielectric in the flex circuit is used in the first area and a second dielectric in the flex circuit is used in a second area on the flex circuit that has one of a longer radius of curvature and a flat area. The flex circuit is of uniform thickness.

The flex circuit herein described may be used when the flex circuit needs to be bent sharper than a radius of curvature smaller than is supported by the second dielectric. The second dielectric has more desired characteristics, such as losses in high frequency signals, leakage, and coefficient of expansion. In such a bend, the first dielectric is used to support the necessary bend without forming cracks in wiring on the flex circuit. Where such a bend is not required, that is, a "flatter" portion of the flex circuit, the second dielectric is used, advantageously employing the more desired characteristics mentioned above.

Small radius of curvatures may be required in various applications. For example, a flex circuit may need to be folded back against itself. In another example, an electronic enclosure may contain sensitive, perhaps cryptographic, components, and detection of tampering, such as drilling into the electronic enclosure or prying the electronic enclosure open is a requirement. The flex circuit may be "formed" into a concave portion of the electronic enclosure, typically resulting in a small radius of curvature. The flex circuit may contain a pattern of wiring on one or more levels. Drilling or prying open the electronic enclosure would break one or more of the wires in the pattern of wiring to expose the tampering. Several drawings will be discussed later of electronic enclosures having flex circuits.

In the drawings and the Detailed Description, like numbers generally refer to like components, parts, steps, and processes.

Figure 1C:
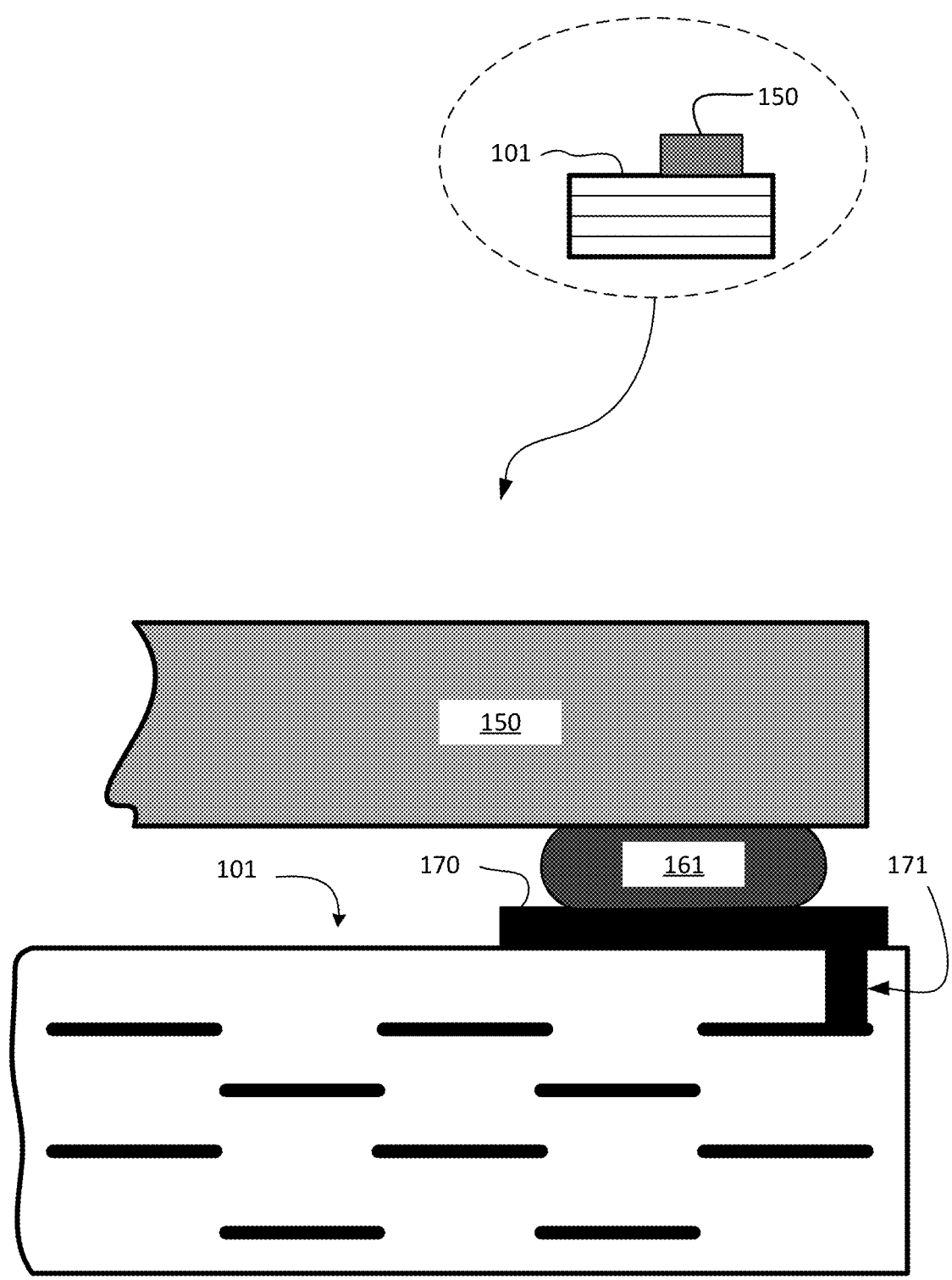
FIG. 1C shows a cross section of a semiconductor chip and a semiconductor chip mounted on a flex circuit.

With reference now to FIGS. 1A, 1B, and 1C, a top view of a flex circuit having embodiments of the invention is shown.

FIG. 1A is a top view of flex circuit 101. Semiconductor chips 150 and 151 may be mounted on flex circuit 101 by conventional means, such as wire bonding or surface mount connections. A battery 152 may also be mounted on flex circuit 101 to supply energy to one or both semiconductor chips 150 and 151. Cross section at A-A in FIG. 1B is depicted in FIG. 1A.

FIG. 1B shows the cross sectional view at A-A. Wiring levels 102, 103, and 104 are shown. More or fewer wiring levels are contemplated. Areas 110 (one at left; one at right) are areas that use the dielectric 2 described above, henceforth will be referred to as HT areas. Area 111 uses dielectric 1, the dielectric that can reliably bend at a small radius of curvature, henceforth will be referred to as FR areas. FIG. 1B shows flex circuit 101 bent at radius of curvature 106. The bend area is called a transition zone. Wires on wiring levels 103 and 104 are shown to be continuous. A wire on wiring level 102 is shown as wire 102A and 102B which would, if area 111 were implemented in the more brittle HT dielectric would break, shown as gap 105. Therefore, area 111 is implemented using FR dielectric to prevent such breakage in the transition zone.

FIG. 1C shows semiconductor chip 150 mounted on flex circuit 101 and a blow-up of the chip, interconnection, and wiring pattern is shown. Semiconductor chip 150 is mounted on flex circuit 101 using a surface connect element 161 to plating 170 and dropping down to an upper level wiring signal via 171. In an electronic enclosure protecting a sensitive circuit, flex circuit 101 may be formed against a concave section of the electronic enclosure and held there using adhesive 465 as shown, e.g., in FIG. 4A, and described later. An attempt to tamper with the electronic enclosure by drilling would break one or more of the wiring pattern on the wiring levels, thereby detecting the tampering attempt.

Figure 4A:
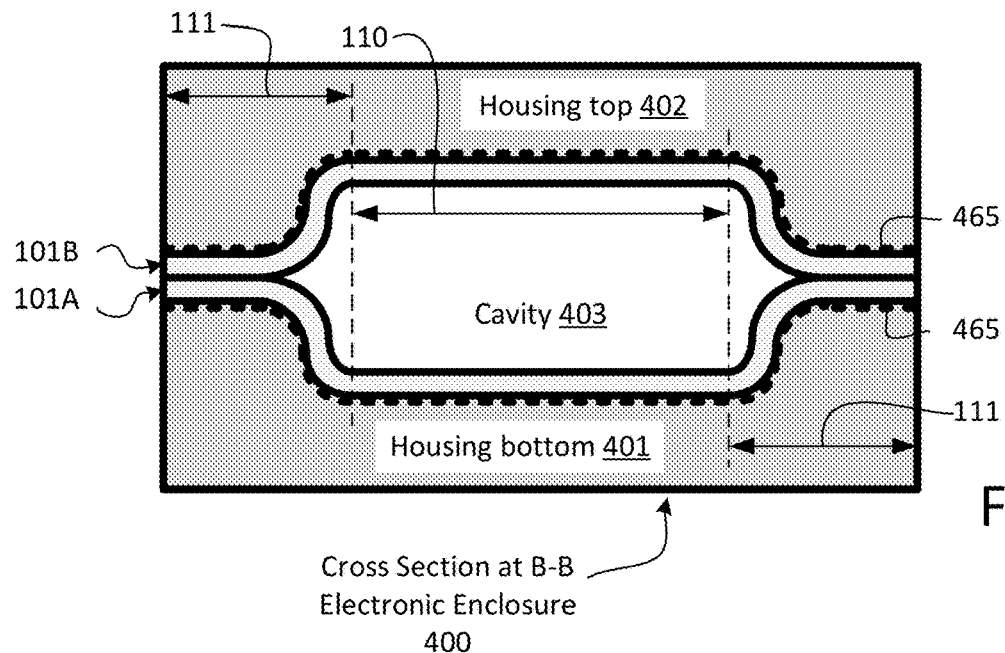
FIGS. 4A and 4B show a top and cross sectional view of an electrical enclosure with FR and HT dielectric areas shown.
Figure 4B:
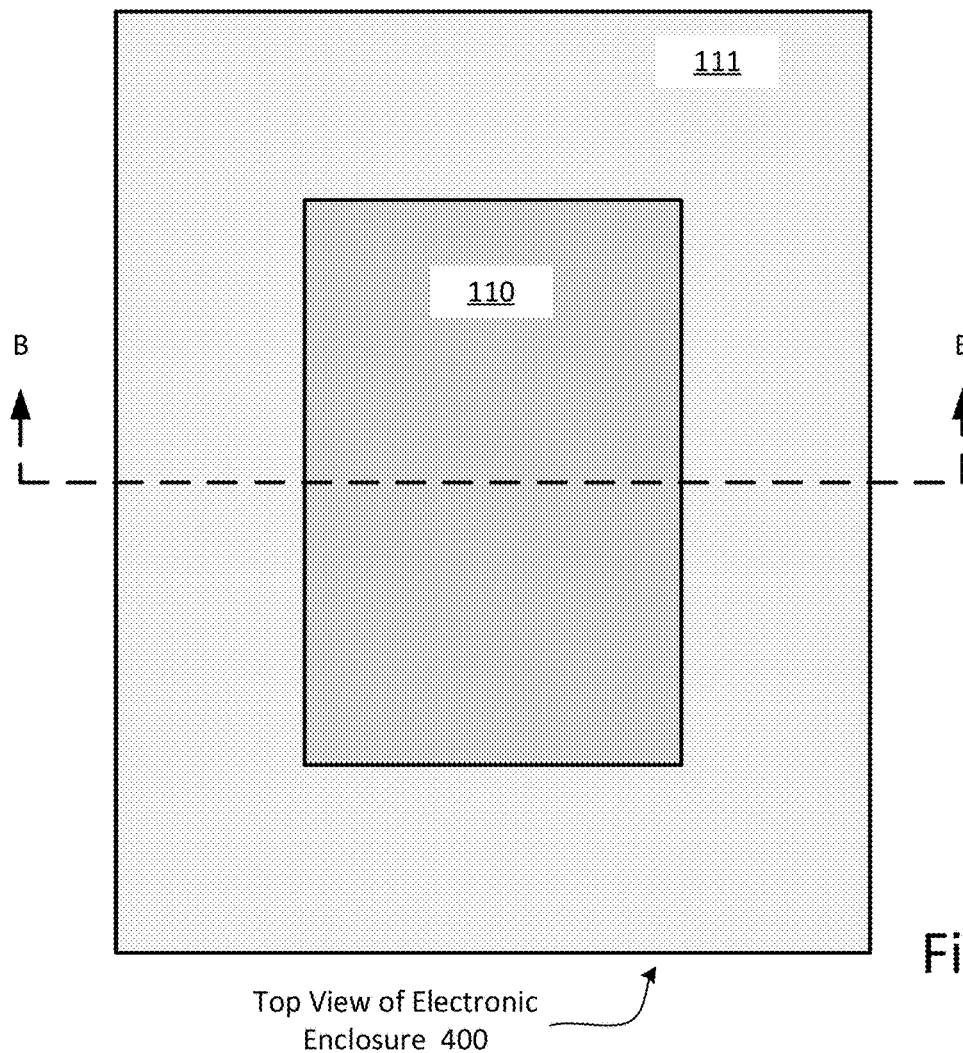
Figure 8:
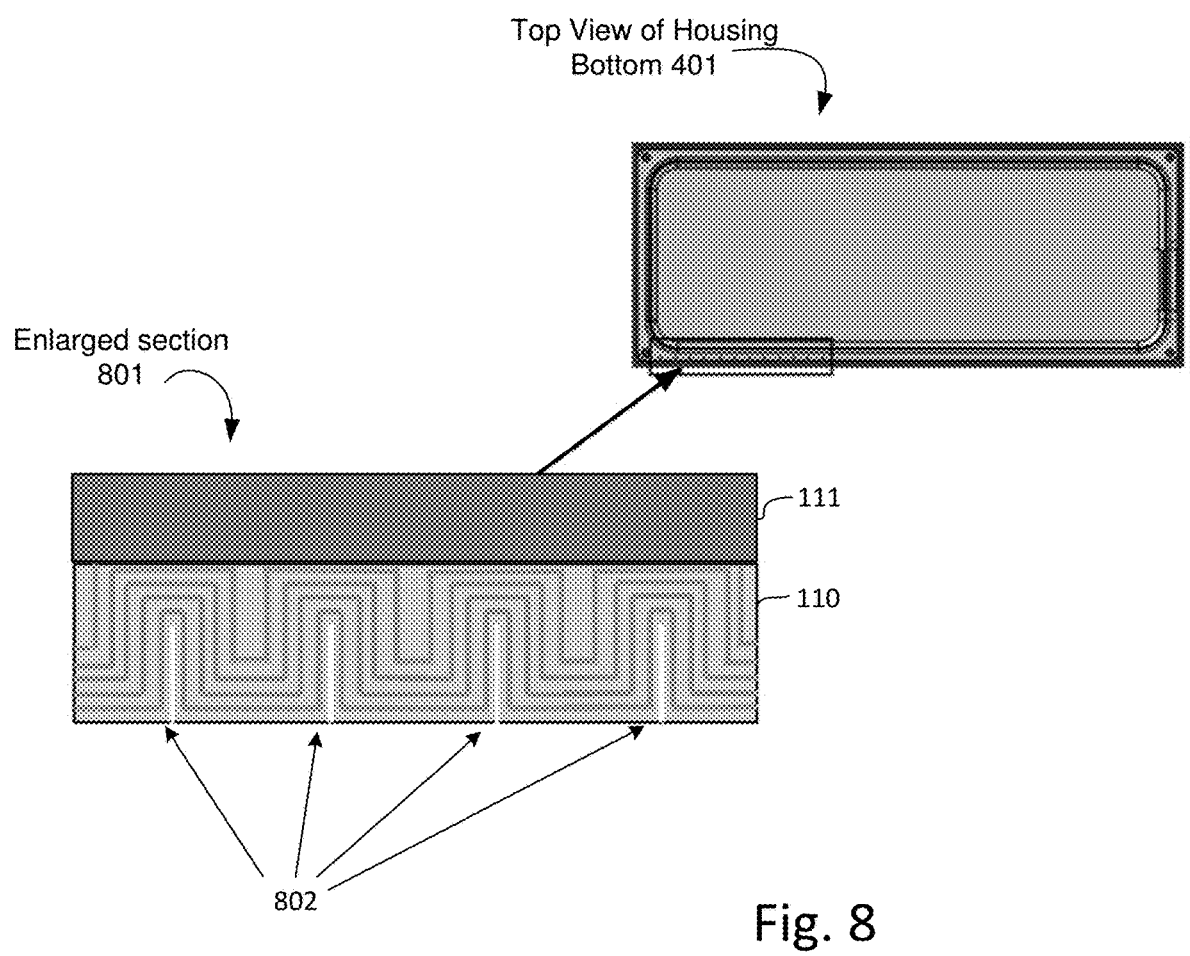
FIG. 8 shows a layout of a layer of flex circuit having partial "gaps" in the flex circuits that would facilitate tearing if the electronic enclosure is pried open.

FIGS. 4A and 4B show an electronic enclosure 400, a top view in FIG. 4B and a cross sectional view at B-B in FIG. 4A. Electronic enclosure 400 comprises a housing top 402, a housing bottom 401 and a cavity 403. Flex circuits 101A and 101B are shown formed into the concavities of housing top 402 and housing bottom 401 and adhered with adhesive 465 to the contours of housing top 402 and housing bottom 401. HT area 110 and FR area 111 are shown in top view 4B and in cross sectional view 4A. In cross sectional view 4A, the double arrow line referenced 110, flex circuits 101A and 101B use HT area 110; in the two double arrowed lines referenced 111, flex circuits 101A and 101B use FR area 111 where a transition area occurs in housing top 402 and housing bottom 401 to accommodate the bends in the transition areas. In the flat area in the center of cavity 403, HT area 110 is used to take advantage of the more desirable dielectric parameters of the HT dielectric. In practice, the majority of housing top 402 and housing bottom 401 would typically be covered by HT area, as shown in FIG. 8. Currently, FIGS. 4A and 4B are drawn to accentuate the curved areas, which in practice, will typically be small compared to the actual size of the electronic enclosure (see FIG. 8 for more typical curved areas). For example, HT area 110 may be 90% or greater of the area in FIG. 4B and FT area 111 may be 10% or less of the area in FIG. 4B. The concentric rectangle arrangement shown in FIG. 4B facilitates laminations of the two dissimilar materials (i.e., HT area 110 and FT area 111) with different lamination temperatures. HT area 110 is laminated at about 300° C. and FR area 111 is laminated at about 200° C.

Figure 4C:
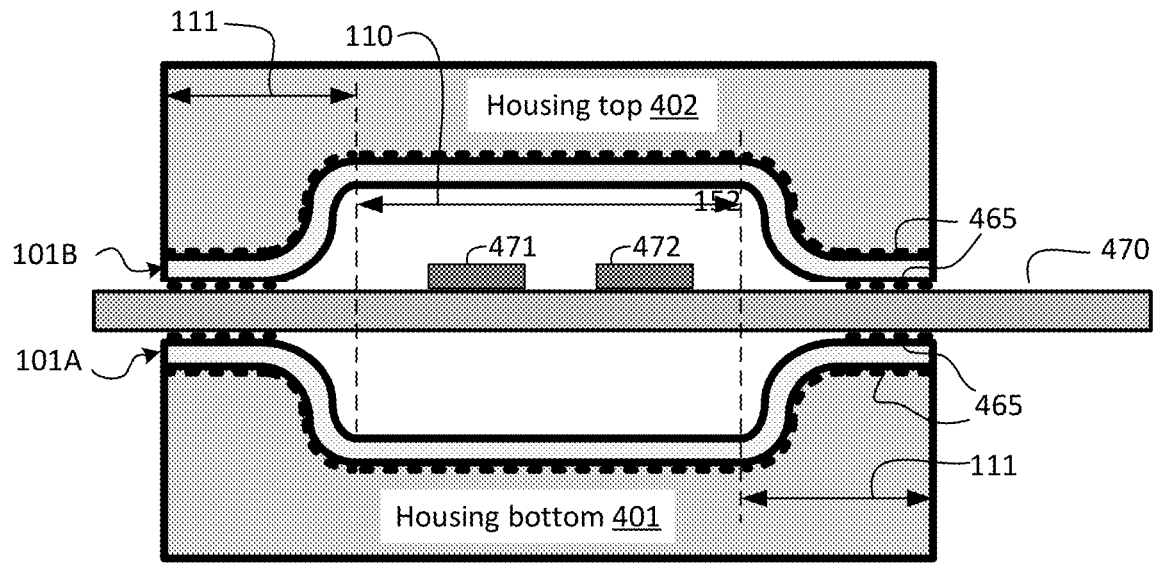
FIG. 4C shows the cross sectional view of the electrical enclosure including a printed circuit board (PCB) and a chip inside the electrical enclosure.

FIG. 4C shows the electronic enclosure 400, including a cross section of printed circuit board (PCB) 470 sandwiched between flex circuit 101A and 101B as shown. PBC 470 may be adhered to flex circuits 101A and 101B with adhesive 465. PCB 470 may have a semiconductor chip 471 and a battery 472 electrically and mechanically attached. Sensitive information such as cryptographic keys may be stored in semiconductor chip 471. Battery 472 may supply energy to destroy the sensitive information in semiconductor chip 471 when tampering with electronic enclosure 400 is detected.

Figure 5:
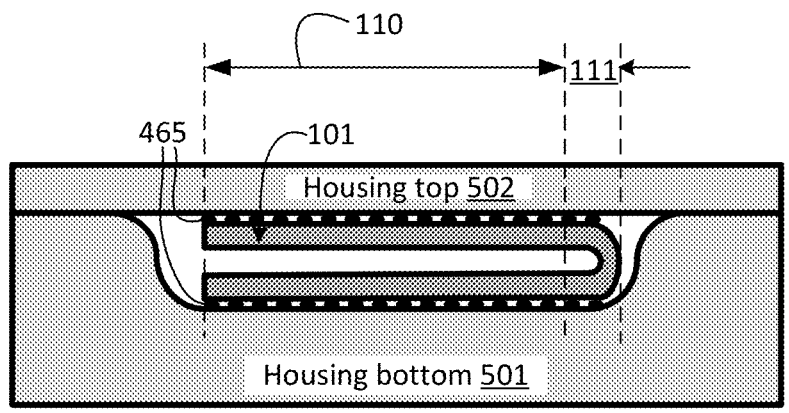
FIG. 5 shows an electronic enclosure having a flex circuit folded 180 degrees with FR and HT dielectric areas shown.

FIG. 5 is an example of an electronic enclosure 500. Flex circuit 101 is shown with a 180 degree bend. Electronic enclosure 500 is shown in cross section and comprises housing bottom 501, housing top 502, and flex circuit 101. It is understood that semiconductor chips or other electronic components may be mounted on flex circuit 101, but for simplicity are not shown in FIG. 5. Flex circuit 101 is shown having a 180 degree bend and is folded back against itself at a transition zone where the fold occurs, resulting in a small radius of curvature at the bend. HT areas 110 are shown used in the flat sections of flex circuit 101 and FR area 111 is shown at the bend. As before, this provides large areas of flex circuit 101 having the desirable characteristics of HT dielectric, and a relatively small area of flex circuit 101 that gives up the desirable characteristics of HT dielectric but gains the flexibility of the FR dielectric in the bend area. Flex circuit 101 is bonded to housing bottom 501 and housing top 502 using adhesive 465. Housing top 502 and housing bottom 501 may be attached where they meet by adhesive, screws, or other known attachment method.

Figure 2B:
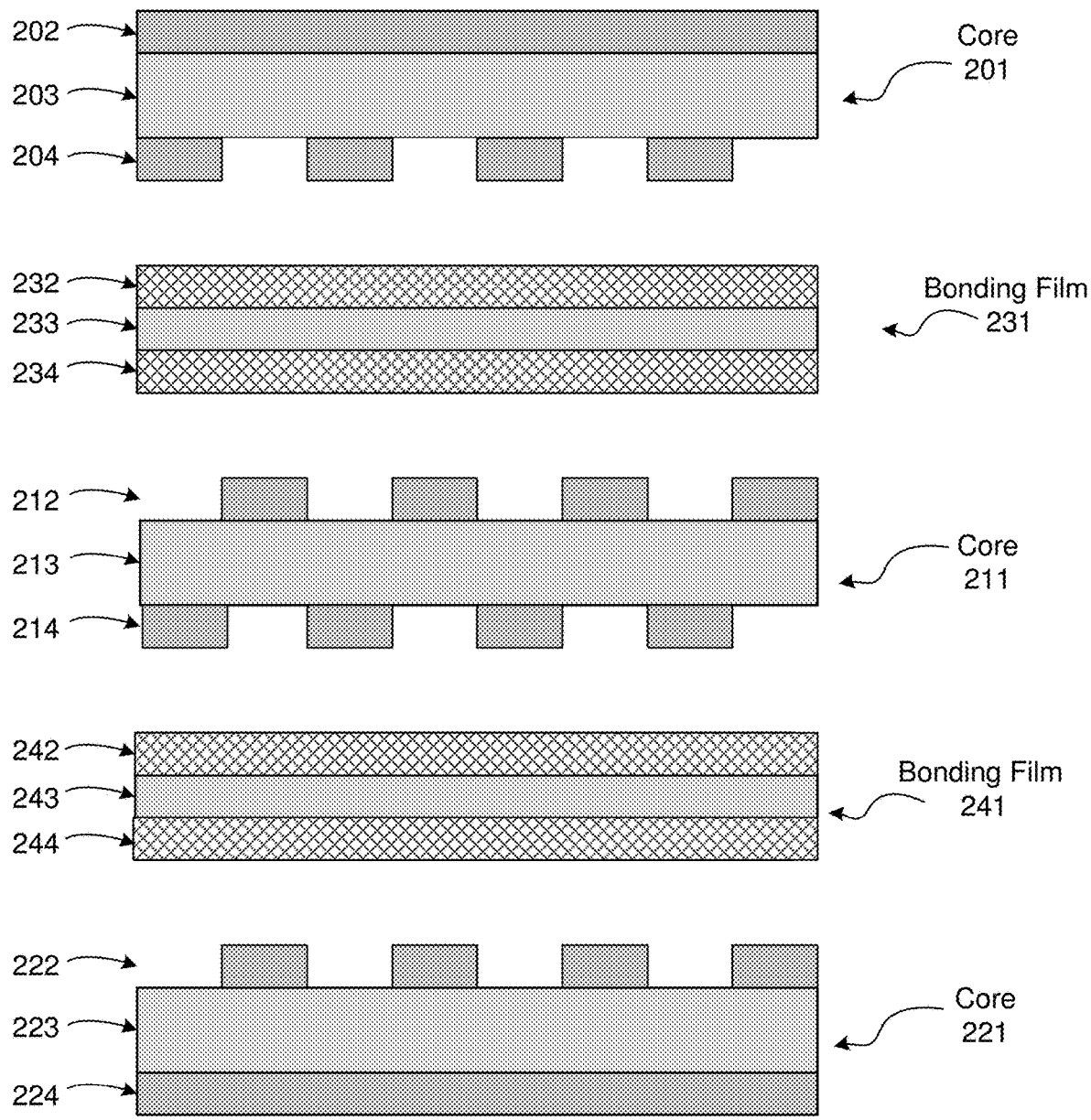
FIG. 2B shows a cross section of the materials of FIG. 2A after etching.

Referring now to FIG. 2A, raw materials for area 111 of flex circuit 101 are shown as raw materials before etching and lamination. Dielectric area 111 is the "FR" dielectric area which is used where flex circuit 101 must bend with a small radius of curvature. A "small radius of curvature" means that area 111 can reliably bend at that radius of curvature but area 110 cannot be reliably bend at that radius of curvature. The exemplary flex circuit 101 used for exemplary purposes in FIGS. 2A, 2B, 2C (for FR area 111 dielectric) and in FIGS. 3A, 3B, and 3C show three cores, but more or fewer cores are contemplated.

FIG. 2A shows referenced numbered layers and thicknesses of each layer.

"Core 1" 201 comprises 0.35 mil copper (Cu) metallization 202 and 204, and 1.0 mil polyimide 203. As mentioned earlier, core 201 may be AP7163E.

"Bonding film 1" 231 comprises 0.50 mil FR adhesive layers 232 and 234, and 0.5 mil polyimide 233.

"Core 2" 211 comprises 0.35 mil metallization layers 212 and 214, and 1.0 mil polyimide 213. Core 311 may be AP7163E.

"Bonding film 2" 241 comprises 0.50 mil FR adhesive layers 242 and 244, and 0.5 mil polyimide 243.

"Core 3" 221 comprises 0.35 mil metallization layers 222 and 224, and 1.0 mil polyimide 223. Core 201 may be AP7163E.

FIG. 2B shows a cross section of the raw material layers of FIG. 2A after etching the metallization layers. As shown, a 50% etching is done to produce a fine line pattern. In an embodiment, the fine line pattern has wiring going in the same direction, but alternating wiring layers have wires and spaces alternating as shown. This may be useful to prevent drilling through the flex circuit 101 without breaking a wire on a wiring layer. Top metallization layer 202 and bottom metallization layer 224 are shown in FIG. 2B as not being etched; however, portions of metallization layers 202 and 224 may be etched in a pattern to provide metal connections to circuits such as semiconductor chips 150 and 151.

Figure 2C:
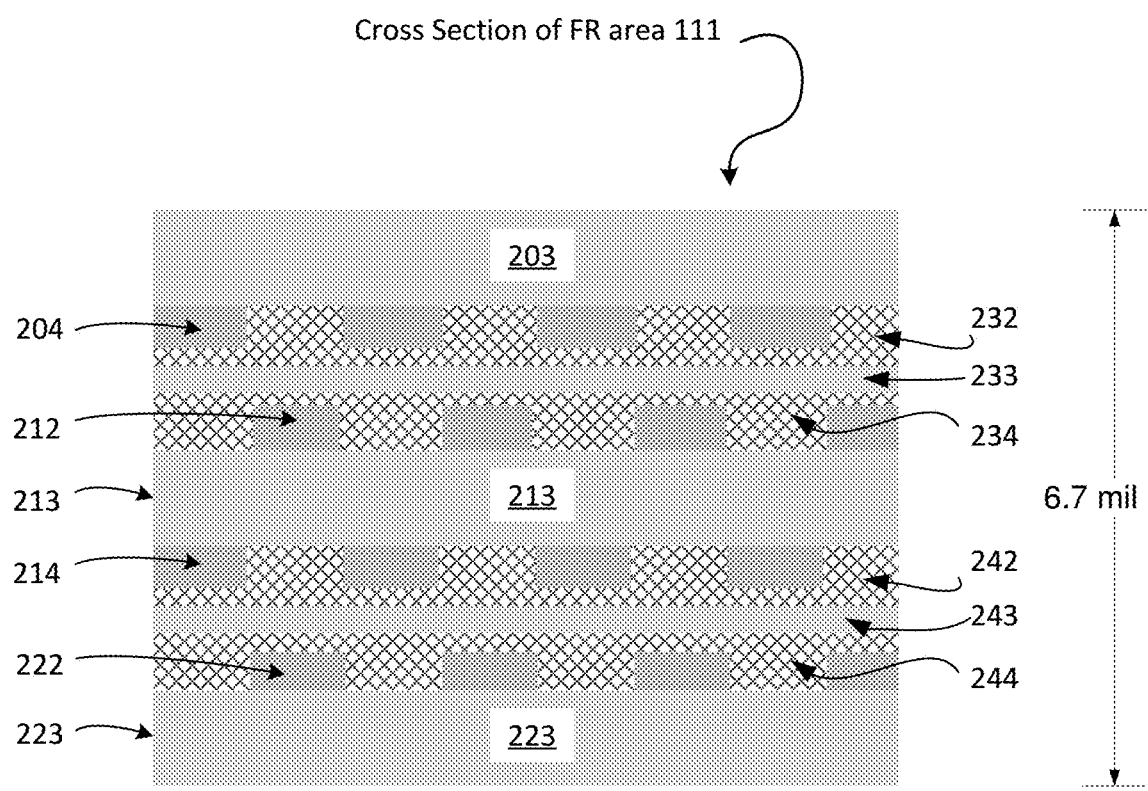
FIG. 2C shows a cross section of the materials of FIG. 2A after etching and lamination.
Figure 3B:
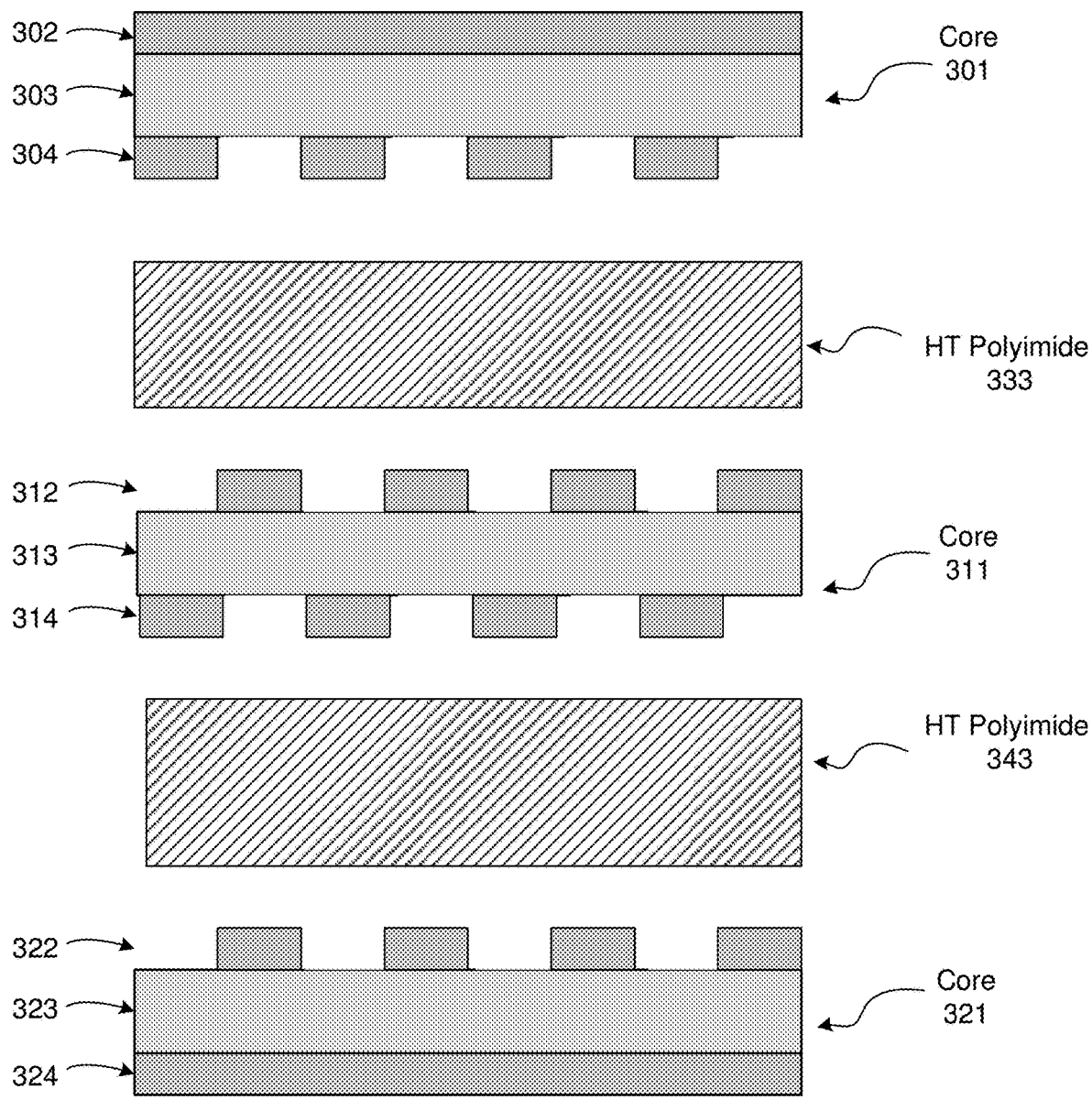
FIG. 3B shows a cross section of raw materials of FIG. 3A after etching.
Figure 3C:
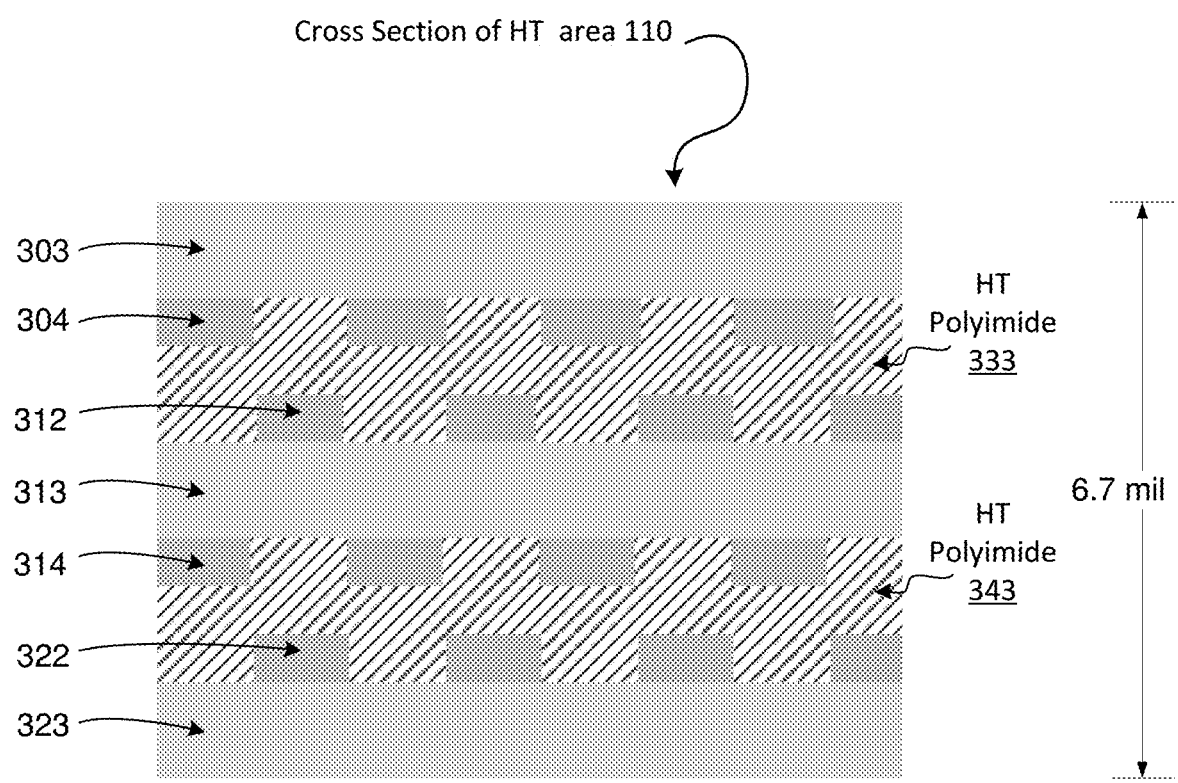
FIG. 3C shows a cross section of the materials of FIG. 3A after etching and lamination.
Figure 3D:
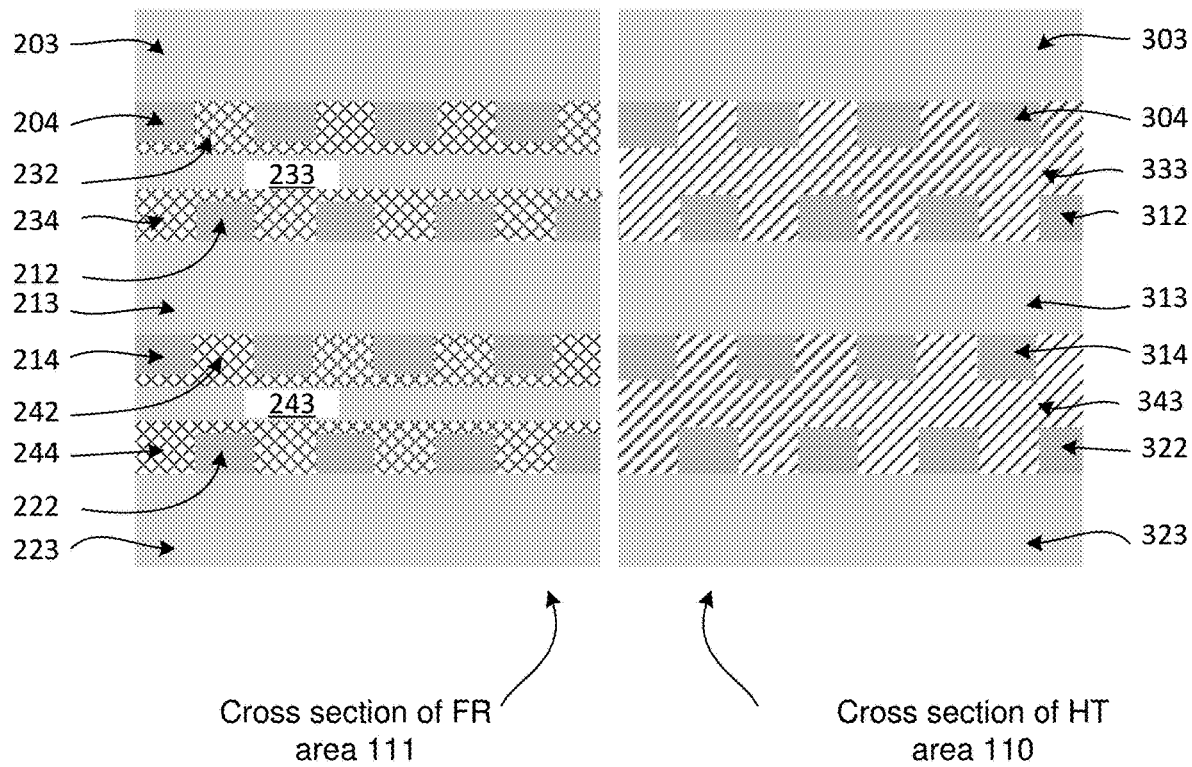
FIG. 3D shows a side by side comparison of an FR section and an HT section, both sections having the same thickness after lamination to make a uniform thickness over the length of the flex circuit.

FIG. 2C shows a cross section of the raw material layers of FIG. 2B after lamination. Note that the flex circuit 111 is 6.7 mils thick. Metallization layers 202 and 224 have been removed in this cross section. Reference numbers refer to the same levels as shown in FIGS. 2A and 2B.

With reference now to FIG. 3A, raw materials for area 110 of flex circuit 101 are shown as raw materials before etching and lamination. Dielectric area 110 is the "HT" dielectric area which is used where flex circuit 101 may bend with a relatively large radius of curvature or a flat area. FIG. 3A shows referenced numbered layers and thicknesses of each layer.

"Core 1" 301 in FIG. 3A is the same as "Core 1" 201 in FIG. 2A but will be referenced as "core 1" 301, and comprises 0.35 mill Cu metallization layers 302, 304, and 1.0 mil polyimide layer 303. Core 301 may be AP7163E such as Pyralux® AP (AP7163E, DuPont).

"Bonding layer 1" 331 comprises 1.50 mil HT polyimide 333.

"Core 2" 311 comprises 035 mil Cu layers 312, 314, and 1.0 mil polyimide 313. Core 311 may be AP7163E.

"Bonding film 2" 341 comprises 1.50 mil HT polyimide 343.

"Core 3" 321 comprises 0.35 mil Cu layers 322, 324, and 1.0 mil polyimide 323. Core 321 may be AP7163E.

FIG. 3B shows the raw materials, with same reference numbers, as FIG. 3A, with patterns etched in metallized layers 304, 312, 314, and 322. As with the FR area cross sections earlier, metallized layers 302 and 324 may or may not be etched.

FIG. 3C shows a cross section of flex circuit 101 in a section 110 "HT" area. Reference numbers are the same as cited earlier.

The thickness of flexible circuit HT area 110 after lamination is 6.7 mils, as shown in FIG. 3C. This is the same thickness as flexible circuit FR section 111 as shown in FIG. 2C. The core sections are of the same materials and thickness for the areas 111 and 110. The adhesive bondply sections for the FR area 111 and the HT area 110 must be specified such that, after lamination, the thickness of flex circuit 101 is of uniform thickness.

While the drawings, for simplicity, show cores separately (i.e., cores 201, 211, and 221 separate from cores 301, 311, and 321), these cores include all the wiring in flex circuit 101 and these cores are continuous. For example cores 201 and 301 are the same core extending the length of flex circuit 101; likewise cores 211 and 311 are the same core extending the length of flex circuit 101; and cores 221 and 321 are the same core extending the length of flex circuit 101. In contrast the bonding films for the FR areas 111 (references 231 and 241) and the HT areas 110 (references 331 and 341) are separate and must be against each other at junctions where the FR areas 111 and HT areas 110 join.

Figure 6:
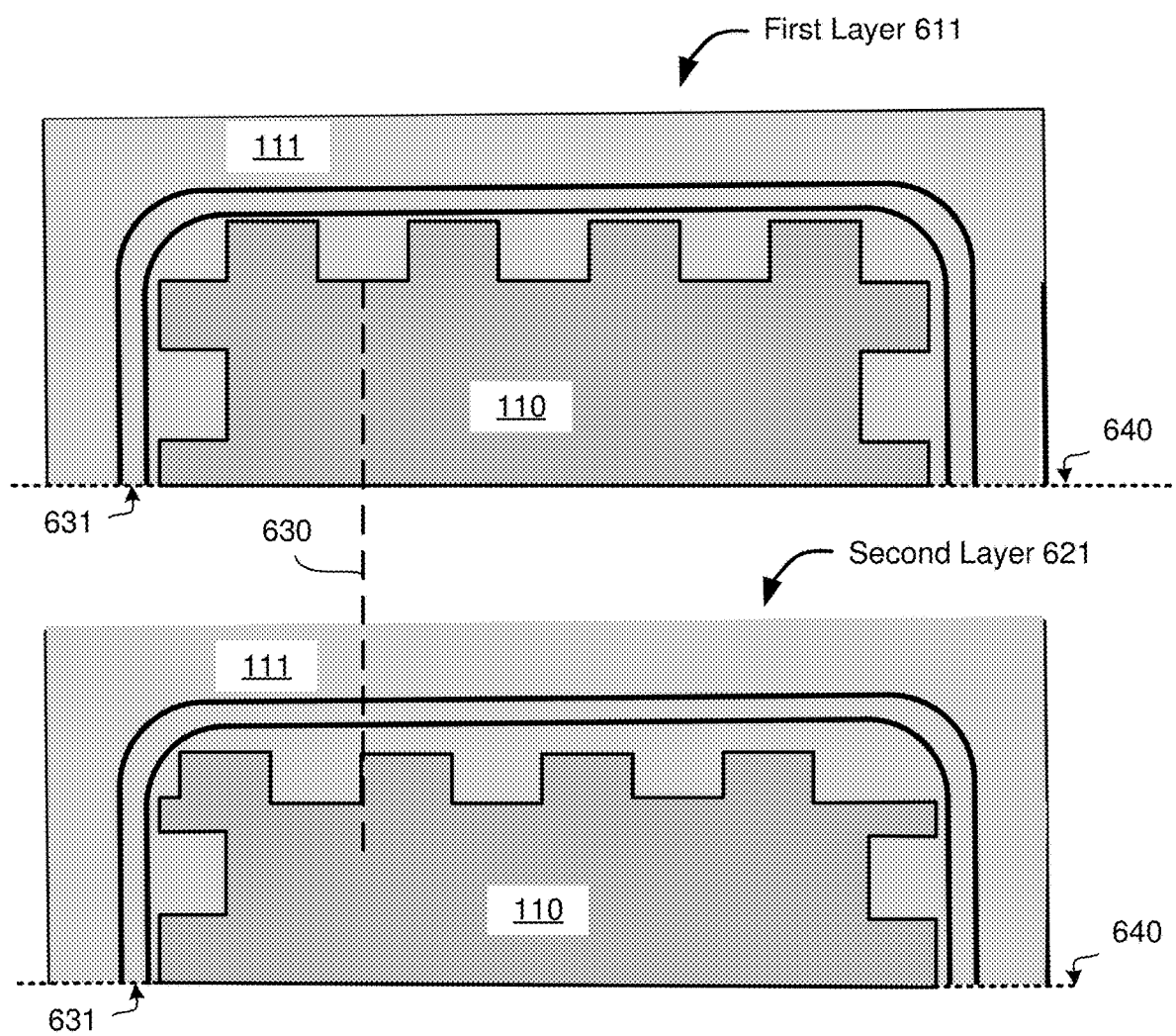
FIG. 6 shows sections of two layers, both layers having an FR section and an HT section partially overlapped to increase tearing should the electronic enclosure be pried open. The tearing would break some or all of the wiring in the wiring layers running through the FR and HR areas.

With reference now to FIG. 6, an embodiment is shown that increases likelihood or tearing and breaking one or more wires on flex circuit 101 when the electronic enclosure is pried open in a tampering event. Electronic enclosure 400 (FIGS. 4A, 4B, and 4C), shown for simplicity as a portion of electronic enclosure 400 beyond dotted line 640, when pried open, will break wiring in at least one of areas 111 and 110. Adhesive 465, such as an epoxy or other strong adhesive, will resist the pry and cause wire breakage in flex circuit 101. FR area 111 is shown in curved area 631 to accommodate a small radius of curvature of FR area 631 as first layer 611 and second layer 621. Curved area 631 may occur when flex circuit 101 is formed into a cavity 403 as shown in FIG. 4A. As shown in FIG. 6, areas of FR area 111 on first layer 611 overlap areas of HT area 110 on second layer 621 as shown by dotted line 630, where an FR area 111 on first layer 611 overlaps a boundary between FR area 111 and HT area 110 on second layer 621. If the electronic enclosure is pried open, the overlap structure will greatly increase likelihood of tearing on both FR area 111 and HT area 110, breaking wiring and thereby detecting a tampering of the electronic enclosure.

Figure 7:
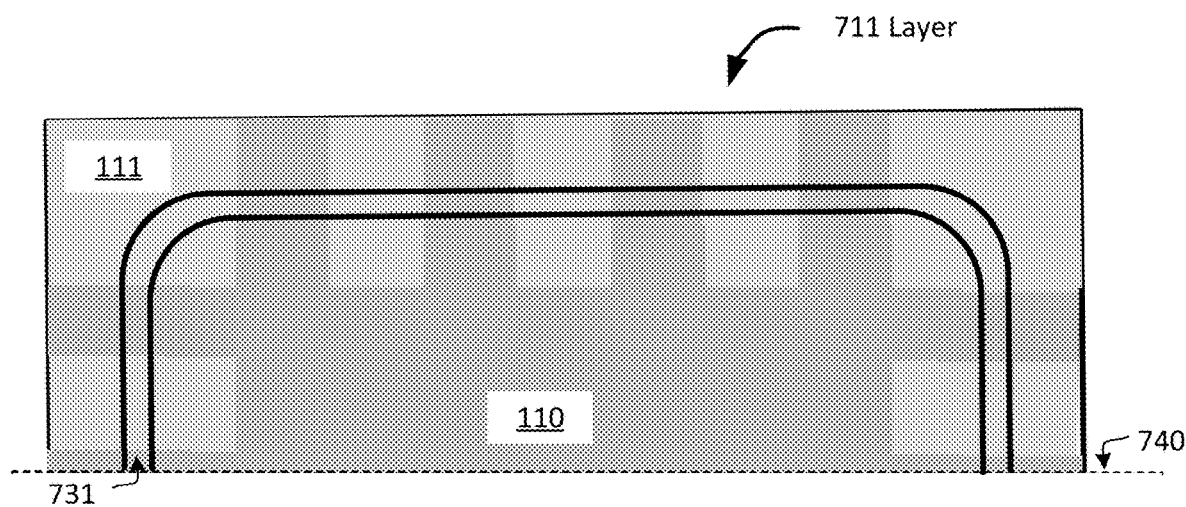
FIG. 7 shows a section having alternating FR and HR near an edge of an electronic enclosure which also promotes tearing to break wiring in the FR and HR areas near an edge of the electronic enclosure if the electronic enclosure is pried open.

FIG. 7 shows another embodiment that increases likelihood of tearing and breaking wiring flex circuit 101 if the electronic enclosure 400 is pried open. Again, for simplicity, only a portion of layer 711 is shown, cut at dotted line 740. In this embodiment, on a single layer of flex circuit 101, portions of FR area 111 and HT area 110 alternate and extend to an edge of flex circuit 101, including over curved area 731. It is understood that, in this embodiment, electronic enclosure 400, the radius of curvature must accommodate minimum radius of curvature of HT area 110.

FIG. 8 shows another embodiment that increases likelihood of tearing and breaking wiring if the electronic enclosure 400 is pried open. This embodiment may also be included as a variant of embodiments described previously. A top view of housing bottom 401 (of electronic enclosure 400 of FIGS. 4A and 4B) is shown. An enlarged section 801 shows a serpentine wiring pattern in HT area 110, in a flat area near the edge of housing bottom 401. Gaps 802 are "slits" in one or more layers having wiring in flex circuit 101. FR area 111 was shown at the edge of flex circuit 101 in FIGS. 4A and 4B to be at the edges of electronic enclosure 400. In the embodiment of FIG. 8, since the edge of housing bottom 401 is flat around the periphery, as shown, HT area 110 may be used on the flat portion to take advantage of his desirable electrical properties, with FR area 111 used to handle the small radius of curvature to the flat bottom portion of housing bottom 401 in enclosure 400 (FIGS. 4A, 4B). As shown in FIGS. 4A and 4B, HT area 110 would also be used for the flat bottom portion. Lamination process would, again, manage laminating both HR area 110 areas using a temperature of about 300° C., and the FR Area 111 ring inside the periphery of housing bottom 401 of electronic enclosure 400 at a temperature of about 200° C. Different lamination temperatures may be done by sequentially laminating the HT area 110 which has the hotter temperature of about 300° C. followed by laminating the FR area 111 which has the cooler temperature of about 200° C. Alternatively, the two-temperature lamination may be accomplished by using two plates at different temperatures that correlate to the pattern between the HR area 110 and FR area 111.

Figure 9:
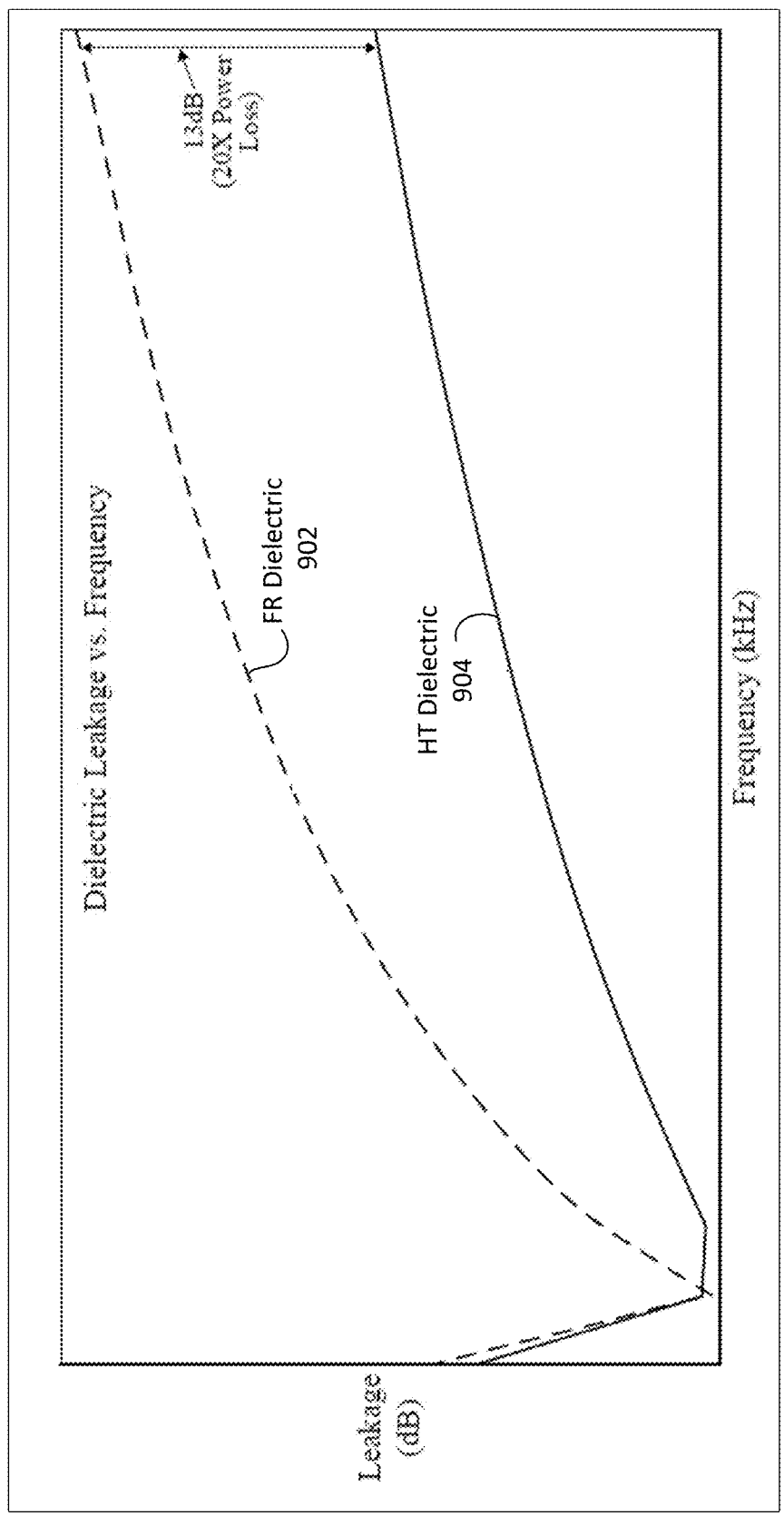
FIG. 9 shows a plot of leakage versus frequency for FR and HT dielectric areas.

FIG. 9 shows an exemplary plot of dielectric leakage in decibels (dB) versus frequency in kilohertz (kHz). By way of example, a range for the vertical axis can span from approximately −92 dB, at the bottom, to −70 dB, at the top. Similarly, a range for the horizontal axis can span from approximately 0 kHz to 1.0 kHz. Wiring in any of the layers of flex circuit 101 may need to carry relatively high frequency signals or occasional pulses having high frequency components. The plot shows very significant power losses in FR areas 111 shown in FR dielectric 902 in FIG. 9 versus HT 110 areas shown as HT dielectric 904 in FIG. 9. In a tamper detection application, energy from a battery (e.g., battery 152 in FIGS. 1A and 1B) inside electronic enclosure 400 may need to destroy sensitive information on a semiconductor chip (150, 151) inside electronic enclosure 400. The sensitive information may be, for example, cryptographic keys. An action that signals a discontinuity in the wiring may include deleting encryption keys within the electronic enclosure. In some embodiments, the minimum operational life of a battery can be specified by a published cryptosecurity specification such as the U.S. Government Federal Information Processing Standard (FIPS) 140-2 Security Requirement for Cryptographic Modules. In such applications, conservation of energy stored in the battery is important.

Figure 10:
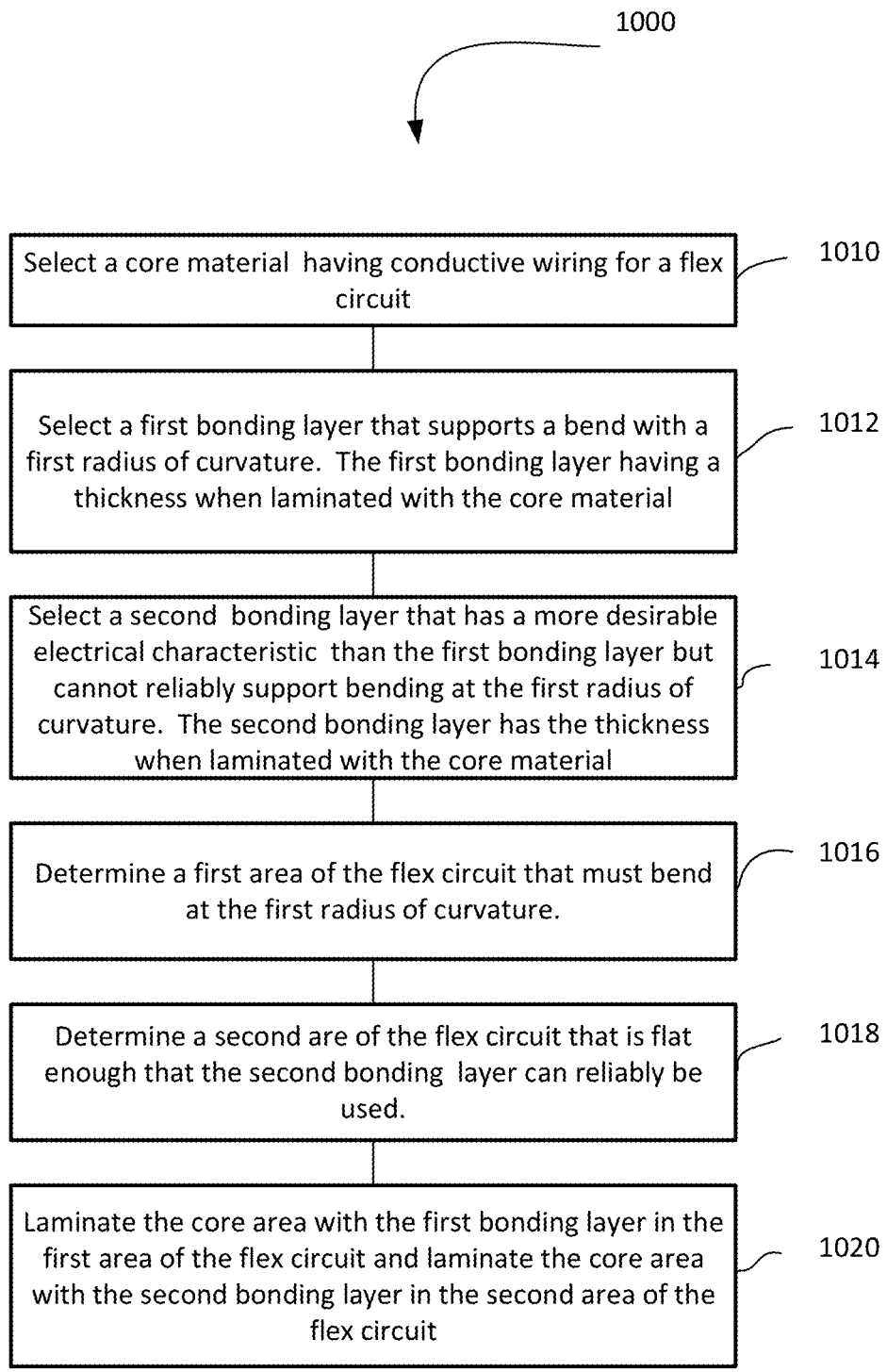
FIG. 10 shows a method for allowing for using FR sections where the flex circuit needs to bend more sharply than an HT section can reliably bend and HT sections where the HT can reliably be used.

FIG. 10 shows method 1000 which may be used to make a flex circuit using HT areas where HT dielectric areas can be reliably used and FR areas where HT dielectric cannot be reliably used.

In step 1010 a core material is selected having conducting material on at least one side that can be etched into wiring.

In step 1012 a first bonding layer is selected that comprises a dielectric and an adhesive on at least one side of the dielectric and supports a first radius of curvature. The first bonding layer has a thickness when laminated to the core material.

In step 1014 a second bonding layer is selected. The second bonding layer has at least one electrical (e.g., leakage) or mechanical characteristic (e.g., temperature coefficient of expansion) more desirable than the same electrical or mechanical characteristic of the first bonding layer. The second bonding layer cannot reliably be bent at the first radius of curvature. The second bonding layer has the thickness when laminated to the core material.

In step 1016 a determination is made in an electronic enclosure one or more areas where a bend of the first radius of curvature is required.

In step 1018 a determination is made in the electronic enclosure of areas where the second bonding layer can reliably be used.

In step 1020 the first bonding layer is laminated to the core material in the one or more areas where a bend of the first radius of curvature is required and the second bonding layer is laminated to the core material in one or more areas where the second bonding layer can reliably be used.

What is claimed is:

1. An apparatus comprising:
   a flex circuit further comprising:
   a core, the core having a polyimide layer having a surface, a pattern of wires is attached to the surface;
   a first dielectric area comprising a first dielectric having a first modulus of elasticity attached to the surface of the core where a transition zone occurs;
   a second dielectric area comprising a second dielectric different than the first dielectric, the second dielectric having a higher modulus of elasticity than the first dielectric, attached to the surface of the core where the first dielectric area is not attached to the surface of the core;
   the transition zone is an area comprising a bend of a specified radius that the first dielectric area can be reliably bent and the second dielectric area cannot be reliably bent; and
   a thickness of the flex circuit is uniform over a length of the flex circuit.

2. The apparatus of claim 1, the first dielectric area is Fire Retardant acrylic adhesive (FR) and the second dielectric area is High Temperature laminate material (HT).

3. The apparatus of claim 1, further comprising:
   one or more electronic components mechanically and electrically coupled to the flex circuits.

4. The apparatus of claim 1, further comprising:
   an electronic enclosure to house at least a portion of the flex circuit, the electronic enclosure comprises a depressed area having a transition zone into which a portion of the flex circuit is formed.

5. The apparatus of claim 4, the electronic enclosure further comprising:
   a housing bottom comprising the depressed area, the flex circuit attached to a surface of the housing bottom by an adhesive.

6. The apparatus of claim 5, the electronic enclosure further comprising:
   a housing top, the flex circuit attached to a surface of the housing top by the adhesive.

7. The apparatus of claim 6, the pattern of wiring having overlapping wiring levels to cause breaking at least one wire in the wiring pattern by a drill in a tempering event.

8. The apparatus of claim 6, the flex circuit further comprising a first dielectric layer and a second dielectric layer;
   the first dielectric layer has a first dielectric area of the first dielectric to reliably bend over the transition zone, the first dielectric area having a plurality of shapes extending into a non-transition zone, a remainder of the first dielectric layer having a second dielectric area of the second dielectric;
   the second dielectric layer has a third dielectric area of the first dielectric to reliably bend over the transition zone, the third dielectric area having a plurality of shapes extending into the non-transition zone that only partially overlap with the plurality of shapes of the first dielectric area, a remainder of the second dielectric layer having fourth dielectric area of the second dielectric; and wiring traces on at least one of the plurality of shapes extending into the non-transition zone.

9. The apparatus of claim 8, the pattern to tear comprising a serpentine wiring pattern having a slit from an edge of the dielectric area to enhance tearing.

* * * * *